(12) United States Patent
Hara et al.

(10) Patent No.: US 12,398,465 B2
(45) Date of Patent: Aug. 26, 2025

(54) CERAMIC HEATER

(71) Applicant: NGK INSULATORS, LTD., Nagoya (JP)

(72) Inventors: Tomohiro Hara, Handa (JP); Yutaka Unno, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 861 days.

(21) Appl. No.: 17/644,827

(22) Filed: Dec. 17, 2021

(65) Prior Publication Data

US 2022/0112599 A1 Apr. 14, 2022

Related U.S. Application Data

(63) Continuation of application No. PCT/JP2020/040362, filed on Oct. 28, 2020.

(30) Foreign Application Priority Data

Dec. 4, 2019 (JP) .................. 2019-219545

(51) Int. Cl.
*C23C 16/458* (2006.01)
*C23C 16/46* (2006.01)
(Continued)

(52) U.S. Cl.
CPC ...... *C23C 16/5096* (2013.01); *C23C 16/4586* (2013.01); *C23C 16/46* (2013.01);
(Continued)

(58) Field of Classification Search
CPC ..... C23C 16/4586; C23C 16/46; C23C 16/50; C23C 16/505; C23C 16/5096;
(Continued)

(56) References Cited

U.S. PATENT DOCUMENTS

2012/0168082 A1 7/2012 Izuo et al.
2014/0373782 A1 12/2014 Park et al.
(Continued)

FOREIGN PATENT DOCUMENTS

CN 109314039 A 2/2019
JP 3602908 B2 12/2004
(Continued)

OTHER PUBLICATIONS

Korean Office Action (with English translation), Application No. 10-2021-7041084, dated Aug. 18, 2023 (12 pages).
(Continued)

*Primary Examiner* — Hung D Nguyen
(74) *Attorney, Agent, or Firm* — BURR PATENT LAW, PLLC

(57) ABSTRACT

A ceramic heater includes a disk-shaped ceramic plate having a wafer placement surface on a front surface thereof, the ceramic plate having a plasma electrode and a heater electrode embedded therein in this order, from closest to the wafer placement surface to farthest, in such a manner that the plasma electrode and the heater electrode are spaced apart from each other; a cylindrical shaft that supports the ceramic plate from a back surface of the ceramic plate; a plasma electrode connecting member arranged in the cylindrical shaft and connected to the plasma electrode; a heater electrode connecting member arranged in the cylindrical shaft and connected to the heater electrode; and a planar shield portion arranged on the back surface of the ceramic plate or embedded in the ceramic plate so as to be closer to the back surface than the heater electrode, the planar shield portion being connected to ground.

9 Claims, 6 Drawing Sheets

(51) Int. Cl.
  *C23C 16/50*    (2006.01)
  *C23C 16/509*   (2006.01)
  *H01L 21/67*    (2006.01)
  *H05B 3/26*    (2006.01)

(52) U.S. Cl.
  CPC ........ *C23C 16/50* (2013.01); *H01L 21/67103* (2013.01); *H05B 3/265* (2013.01)

(58) Field of Classification Search
  CPC ......... H01L 21/67069; H01L 21/67103; H01L 21/67109; H01L 21/67167; H01L 21/683; H01L 21/6831; H01L 21/6833; H01L 21/6835; H01L 21/68792; H05B 3/265; H05B 3/283
  See application file for complete search history.

(56) References Cited

U.S. PATENT DOCUMENTS

| | | | |
|---|---|---|---|
| 2017/0306494 A1 | 10/2017 | Lin et al. | |
| 2018/0218885 A1 | 8/2018 | Maeda et al. | |
| 2019/0096639 A1* | 3/2019 | Takahashi | H01J 37/32091 |
| 2020/0090964 A1 | 3/2020 | Unno et al. | |
| 2020/0090972 A1* | 3/2020 | Benjaminson | H01L 21/67069 |
| 2021/0233750 A1 | 7/2021 | Iizuka | |

FOREIGN PATENT DOCUMENTS

| | | |
|---|---|---|
| JP | 2011-061040 A | 3/2011 |
| JP | 2018-123348 A | 8/2018 |
| KR | 10-2011-0027621 A | 3/2011 |
| KR | 10-2013-0108801 A | 10/2013 |
| KR | 10-2014-0148052 A | 12/2014 |
| KR | 10-2018-0127535 A | 11/2018 |
| TW | 201921421 A | 6/2019 |
| WO | 2011/033849 A1 | 3/2011 |
| WO | 2019/188496 A1 | 10/2019 |
| WO | 2019/225519 A1 | 11/2019 |
| WO | 2020/055565 A1 | 3/2020 |

OTHER PUBLICATIONS

Chinese Office Action (with English translation) dated Jan. 11, 2024 (Application No. 202080048681.2).

International Search Report and Written Opinion (Application No. PCT/JP2020/040362) dated Dec. 22, 2020 (with English translation).

Taiwanese Office Action (Application No. 109137841) dated Jun. 4, 2021.

Japanese Office Action (with English translation) dated Jun. 28, 2022 (Application No. 2021-512822).

English translation of the International Preliminary Report on Patentability (Chapter I) dated Jun. 16, 2022 (Application No. PCT/JP2020/040362).

Taiwanese Office Action (Application No. 109137841) dated Aug. 30, 2023 (6 pages).

\* cited by examiner

CERAMIC HEATER

BACKGROUND OF THE INVENTION

1. Field of the Invention

The present invention relates to a ceramic heater.

2. Description of the Related Art

In the related art, a semiconductor manufacturing process may adopt a plasma CVD process. In the plasma CVD process, a wafer is placed on a wafer placement surface of a ceramic heater. A plasma electrode and a heater electrode are embedded in a ceramic plate of the ceramic heater. An upper electrode is disposed in a space above the wafer. When a high-frequency voltage is applied between the upper electrode and the plasma electrode, plasma is generated between these electrodes, and a thin film is deposited on the wafer using the plasma. In such a ceramic heater, if a leakage current produced by the high-frequency voltage applied to the plasma electrode is transmitted to the heater electrode, there is a problem that energization to the heater electrode is not controllable. In this respect, PTL 1 proposes to provide a high-resistance insulating layer (leakage-current prevention layer) between the plasma electrode and the heater electrode.

CITATION LIST

Patent Literature

PTL 1: JP 3602908 B

SUMMARY OF THE INVENTION

In the ceramic heater described above, however, plasma that has flowed around to a surface (back surface) of the ceramic plate opposite to the wafer placement surface may be coupled to the heater electrode. If such coupling occurs, a high-frequency current flows into the heater electrode, which is not preferable.

The present invention has been made to solve such a problem, and a main object thereof is to prevent plasma that has flowed around to the back surface of a ceramic plate from being coupled to a heater electrode.

A ceramic heater of the present invention includes: a disk-shaped ceramic plate having a wafer placement surface on a front surface thereof, the ceramic plate having a plasma electrode and a heater electrode embedded therein in this order, from closest to the wafer placement surface to farthest, in such a manner that the plasma electrode and the heater electrode are spaced apart from each other; a cylindrical shaft that supports the ceramic plate from a back surface of the ceramic plate; a plasma electrode connecting member arranged in the cylindrical shaft, the plasma electrode connecting member being connected to the plasma electrode; a heater electrode connecting member arranged in the cylindrical shaft, the heater electrode connecting member being connected to the heater electrode; and a planar shield portion arranged on the back surface of the ceramic plate or embedded in the ceramic plate so as to be closer to the back surface than the heater electrode, the planar shield portion being connected to ground.

In this ceramic heater, the planar shield portion prevents coupling between plasma that has flowed around to the back surface of the ceramic plate and the heater electrode. It is therefore possible to prevent the occurrence of an abnormal condition (such as abnormal heat generation or abnormal expansion of the heater electrode) caused by such coupling.

In the ceramic heater of the present invention, the planar shield portion may be a conductive ceramic coating film, a metal mesh, or a metal plate. This enables the planar shield portion to be relatively easily disposed.

In the ceramic heater of the present invention, the planar shield portion may be connected to the ground via a cylindrical conductor on an inner surface or an outer surface of the cylindrical shaft. This eliminates a need to allow a member to pass through the inside of the cylindrical shaft to connect the planar shield portion to the ground. Thus, other members (such as the heater electrode connecting member and the plasma electrode connecting member) are easily arranged in the space inside the cylindrical shaft. In addition, connecting the cylindrical conductor on the inner surface or the outer surface of the cylindrical shaft to the ground can prevent noise generated from the plasma from flowing to the heater electrode connecting member, the plasma electrode connecting member, and the like. Noise can be prevented even if the planar shield portion and the cylindrical conductor on the inner surface or the outer surface of the cylindrical shaft are not connected to each other.

In the ceramic heater of the present invention, the planar shield portion may be parallel to the wafer placement surface. The term "parallel" includes exactly parallel as well as substantially parallel (such as within tolerance) (the same applies in the following).

In the ceramic heater of the present invention, the planar shield portion may have a larger outer diameter than the heater electrode. This makes it easy to prevent coupling between the plasma and the outer peripheral portion of the heater electrode.

In the ceramic heater of the present invention, the ceramic plate and the cylindrical shaft may be made of AlN ceramic, and the planar shield portion may be made of Al or an Al alloy.

The ceramic heater of the present invention may include a side shield portion disposed so as to extend toward the wafer placement surface from an outer edge of the planar shield portion. Thus, the side shield portion prevents coupling between plasma that has flowed around to the side surface side of the ceramic plate and the heater electrode. It is therefore possible to prevent the occurrence of an abnormal condition (such as abnormal heat generation or abnormal expansion of the heater electrode) caused by such coupling. In this case, the side shield portion may be made of Al or an Al alloy. In this case, furthermore, the planar shield portion and the side shield portion may be embedded in the ceramic plate, and the side shield portion may have a distal end positioned between the wafer placement surface and the heater electrode. Thus, coupling between the plasma that has flowed around to the side surface side of the ceramic plate and the heater electrode can be reliably prevented.

In the ceramic heater of the present invention, the planar shield portion may be embedded in the ceramic plate, and a distance from the back surface to the planar shield portion may be larger than a distance from the wafer placement surface to the plasma electrode. The distance from the back surface to the planar shield portion affects plasma density on the wafer placement surface. Accordingly, setting the distance from the back surface to the plasma electrode to a large value can reduce the influence of the planar shield portion on the plasma on the wafer placement surface side. In addition, it is possible to easily prevent coupling between the plasma that has flowed around to the back surface side and the heater electrode. In this case, the distance from the back surface to the planar shield portion may be longer than the distance from the wafer placement surface to the plasma electrode by 2.0 mm or more. For example, when the distance from the wafer placement surface to the plasma electrode is 1.0 mm, the distance from the back surface to the planar shield portion is set to be 3.0 mm or more.

In the ceramic heater of the present invention, the planar shield portion may be embedded in the ceramic plate, and the distance from the back surface to the planar shield portion may be larger than a distance from the planar shield portion to the heater electrode. Thus, the plasma that has flowed around from the back surface can be more effectively prevented by the planar shield portion positioned near the heater electrode.

In the ceramic heater of the present invention, the planar shield portion may be arranged on the back surface of the ceramic plate, the side shield portion may be arranged on a side surface of the ceramic plate, and the side shield portion may have a distal end positioned closer to the back surface than a plane on which the heater electrode lies. This makes it easy to maintain thermal uniformity across the wafer placement surface. In this case, the planar shield portion may be arranged on the back surface of the ceramic plate with a low thermal conductive layer interposed therebetween, the low thermal conductive layer having lower thermal conductivity than the ceramic plate. This allows the low thermal conductive layer to prevent the heat of the ceramic plate from being directly transmitted to the planar shield portion, and thus the planar shield portion can be prevented from being softened or melted.

In the ceramic heater of the present invention, preferably, the planar shield portion is not disposed between the plasma electrode and the heater electrode. The high-frequency power applied to the plasma electrode affects plasma density on the wafer placement surface if the high-frequency power flows to another conductor and is wastefully consumed. For this reason, the planar shield portion is preferably disposed between the back surface and the heater electrode so as to prevent the high-frequency power from flowing from the plasma electrode to the planar shield portion.

DETAILED DESCRIPTION OF THE INVENTION

Figure 1:
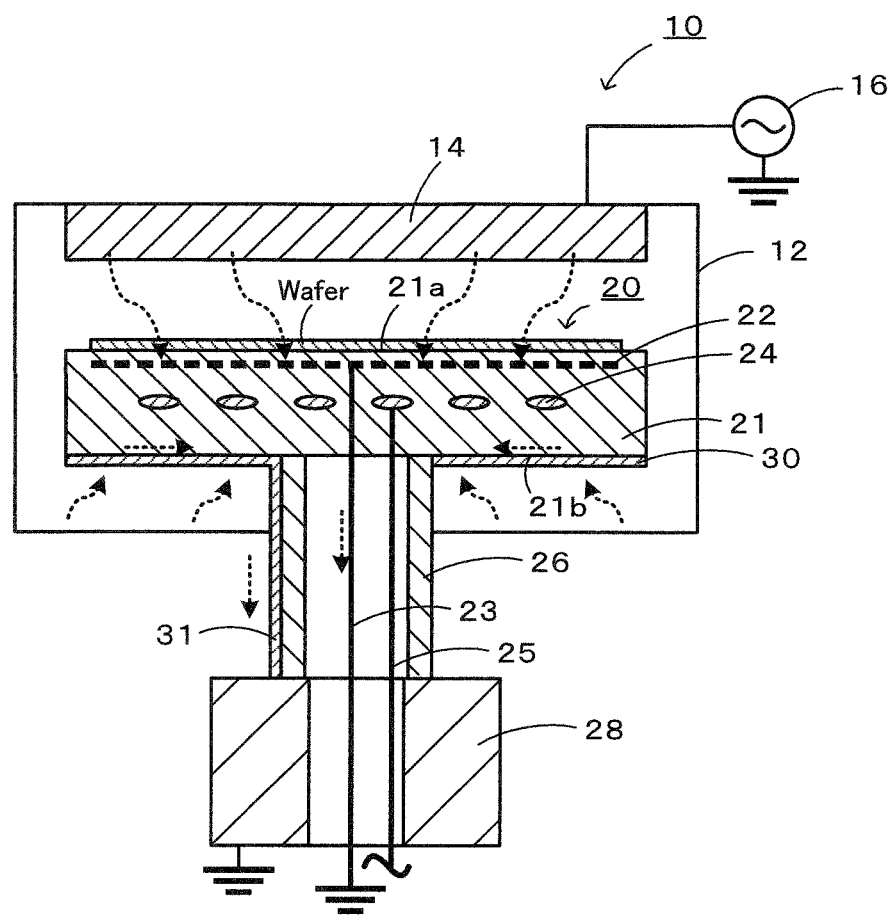
FIG. 1 is a longitudinal sectional view of a plasma treatment device 10.

A preferred embodiment of the present invention will be described hereinafter with reference to the drawings. FIG. 1 is a longitudinal sectional view of a plasma treatment device 10. In FIG. 1, dotted-line arrows indicate plasma or plasma current.

As illustrated in FIG. 1, the plasma treatment device 10 includes a chamber 12, an upper electrode 14, and a ceramic heater 20.

The chamber 12 is a container made of an aluminum alloy or the like and formed into a box shape. The chamber 12 is provided with a pressure regulating valve, a vacuum pump, or the like (not illustrated) such that the inside of the chamber 12 can be adjusted to a desired pressure.

The upper electrode 14 is attached to the ceiling of the chamber 12. The upper electrode 14 is connected to an RF power supply 16 for plasma generation.

The ceramic heater 20 includes a ceramic plate 21, a cylindrical shaft 26, and a conductive film 30.

The ceramic plate 21 is a disk-shaped AlN ceramic member having a wafer placement surface 21a on a front surface thereof. The ceramic plate 21 has a plasma electrode 22 and a heater electrode 24 embedded therein in this order, from closest to the wafer placement surface 21a to farthest, in such a manner that the plasma electrode 22 and the heater electrode 24 are spaced apart from each other.

The cylindrical shaft 26 supports the ceramic plate 21 from a back surface 21b of the ceramic plate 21. The cylindrical shaft 26 is mounted on a perforated metal part 28. The inside of the cylindrical shaft 26 and the hole in the metal part 28 communicate with each other. The metal part 28 is connected to ground. The cylindrical shaft 26 has arranged therein a plasma electrode connecting member 23 connected to the plasma electrode 22, and a heater electrode connecting member 25 connected to the heater electrode 24. The plasma electrode connecting member 23 is connected to the ground. The heater electrode connecting member 25 applies a voltage across the heater electrode 24 to cause the heater electrode 24 to generate heat.

The conductive film (corresponding to the planar shield portion of the present invention) 30 is disposed in an annular region on the back surface 21b of the ceramic plate 21, except for a portion corresponding to the cylindrical shaft 26. The conductive film 30 is preferably parallel to the wafer placement surface 21a. The conductive film 30 may be a coating film made of conductive ceramic. Examples of the conductive ceramic include SiC, TiC, and TiN. The conductive film 30 is connected to the metal part 28 (ground) via a conductive wire 31 disposed over the outer wall of the cylindrical shaft 26 so as to extend in the up-down direction. The conductive wire 31 may be a linear coating film made of conductive ceramic.

In the ceramic heater 20 of this embodiment described above, the plasma current acting from the back surface side of the ceramic plate 21 flows to the ground via the conductive film 30. That is, the conductive film 30 prevents coupling between the plasma that has flowed around to the back surface side of the ceramic plate 21 and the heater electrode 24. It is therefore possible to prevent the occurrence of an abnormal condition (such as abnormal heat generation or abnormal expansion of the heater electrode 24) caused by such coupling.

If the conductive wire 31 is a linear coating film made of conductive ceramic disposed over the outer wall of the cylindrical shaft 26 so as to extend in the up-down direction, wiring of a conductive wire inside the cylindrical shaft 26 is not necessary. In addition, the influence of the conductive wire 31 on the chamber side is smaller than that in a case where a conductive wire is disposed in the chamber 12.

It is understood that the present invention is not limited to the embodiment described above in any way and may be carried out in various modes so long as they fall within the technical scope of the present invention.

Figure 2:
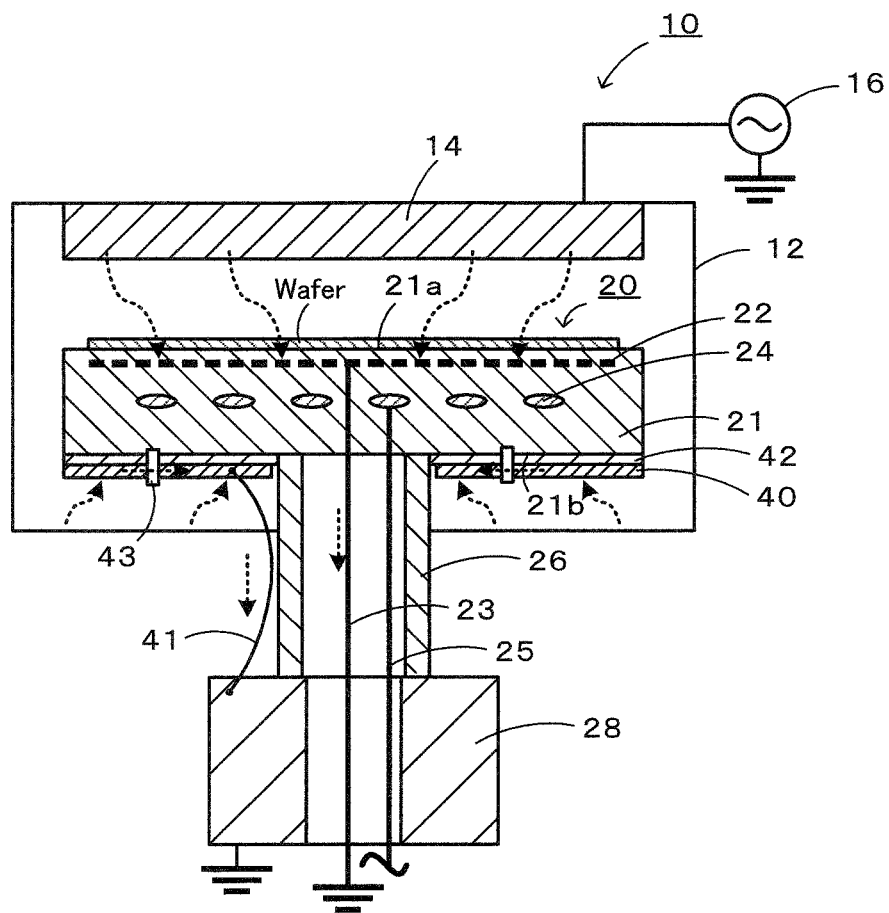
FIG. 2 is a longitudinal sectional view of a modification of the plasma treatment device 10.

For example, a metal cover 40 and a conductive wire 41 illustrated in FIG. 2 may be used instead of the conductive film 30 and the conductive wire 31 in the embodiment described above. In FIG. 2, the same components as those in the embodiment described above are denoted by the same numerals. The metal cover 40 (corresponding to the planar shield portion of the present invention) is a doughnut-shaped metal plate and is disposed in an annular region on the back surface 21b of the ceramic plate 21, except for a portion corresponding to the cylindrical shaft 26. The metal cover 40 is secured to the back surface 21b of the ceramic plate 21 with a low thermal conductive layer 42 interposed therebetween, the low thermal conductive layer 42 having lower thermal conductivity than the ceramic plate 21, by screws 43. The metal cover 40 is preferably parallel to the wafer placement surface 21a. The low thermal conductive layer 42 is made of, for example, alumina ceramic when the ceramic plate 21 is made of AlN ceramic. The metal cover 40 is connected to the metal part 28 (ground) via the conductive wire 41 provided outside the cylindrical shaft 26. In FIG. 2, the metal cover 40 prevents coupling between the plasma that has flowed around to the back surface side of the ceramic plate 21 and the heater electrode 24. It is therefore possible to prevent the occurrence of an abnormal condition (such as abnormal heat generation or abnormal expansion of the heater electrode 24) caused by such coupling. In addition, since the low thermal conductive layer 42 prevents the heat of the ceramic plate 21 from being directly transmitted to the metal cover 40, the metal cover 40 can be prevented from being softened or melted. Such an effect is effectively obtained, in particular, when the metal cover 40 is made of Al or an Al alloy and the low thermal conductive layer 42 is an alumina layer. Like the conductive wire 31 in FIG. 1, the conductive wire 41 in FIG. 2 may be disposed over the outer wall of the cylindrical shaft 26 so as to extend in the up-down direction.

Figure 3:
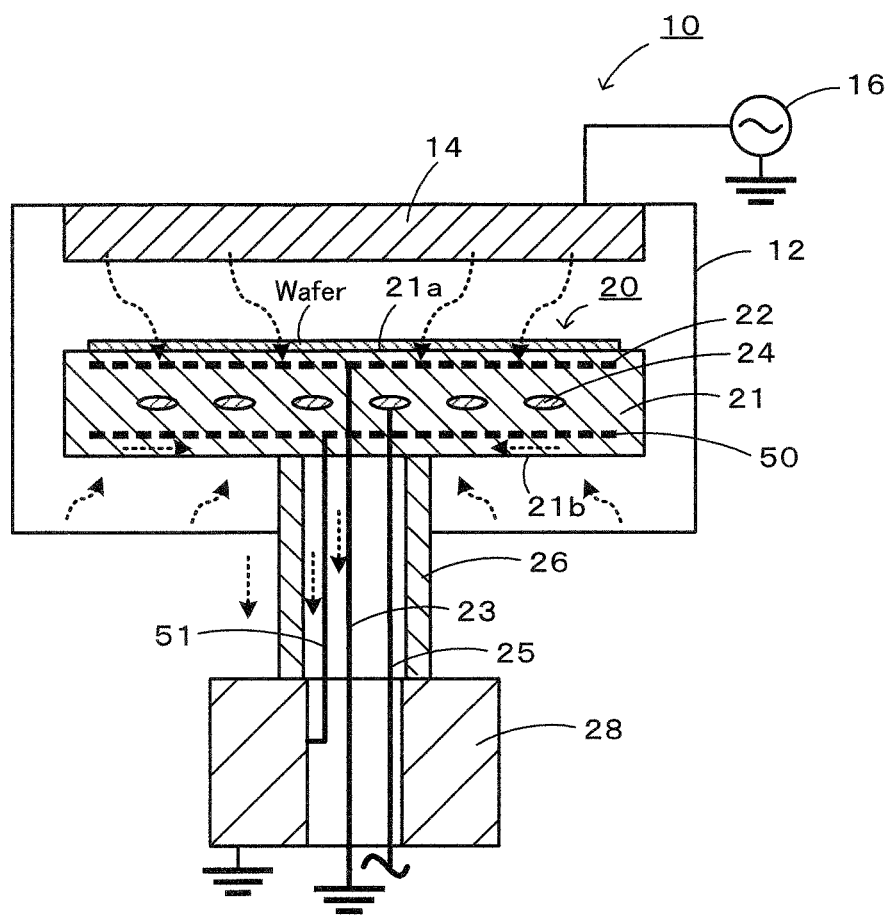
FIG. 3 is a longitudinal sectional view of a modification of the plasma treatment device 10.

Alternatively, a shield electrode 50 and a conductive wire 51 illustrated in FIG. 3 may be used instead of the conductive film 30 and the conductive wire 31 in the embodiment described above. In FIG. 3, the same components as those in the embodiment described above are denoted by the same numerals. The shield electrode 50 (corresponding to the planar shield portion of the present invention) is a metal planar member embedded in the ceramic plate 21 so as to be closer to the back surface side than the heater electrode 24. The shield electrode 50 is preferably parallel to the wafer placement surface 21a. The shield electrode 50 may be a mesh of a metal material (such as Mo). The shield electrode 50 is connected to the metal part 28 (ground) via the conductive wire 51 disposed inside the cylindrical shaft 26. In FIG. 3, the shield electrode 50 prevents coupling between the plasma that has flowed around to the back surface side of the ceramic plate 21 and the heater electrode 24. It is therefore possible to prevent the occurrence of an abnormal condition (such as abnormal heat generation or abnormal expansion of the heater electrode) caused by such coupling.

Figure 4:
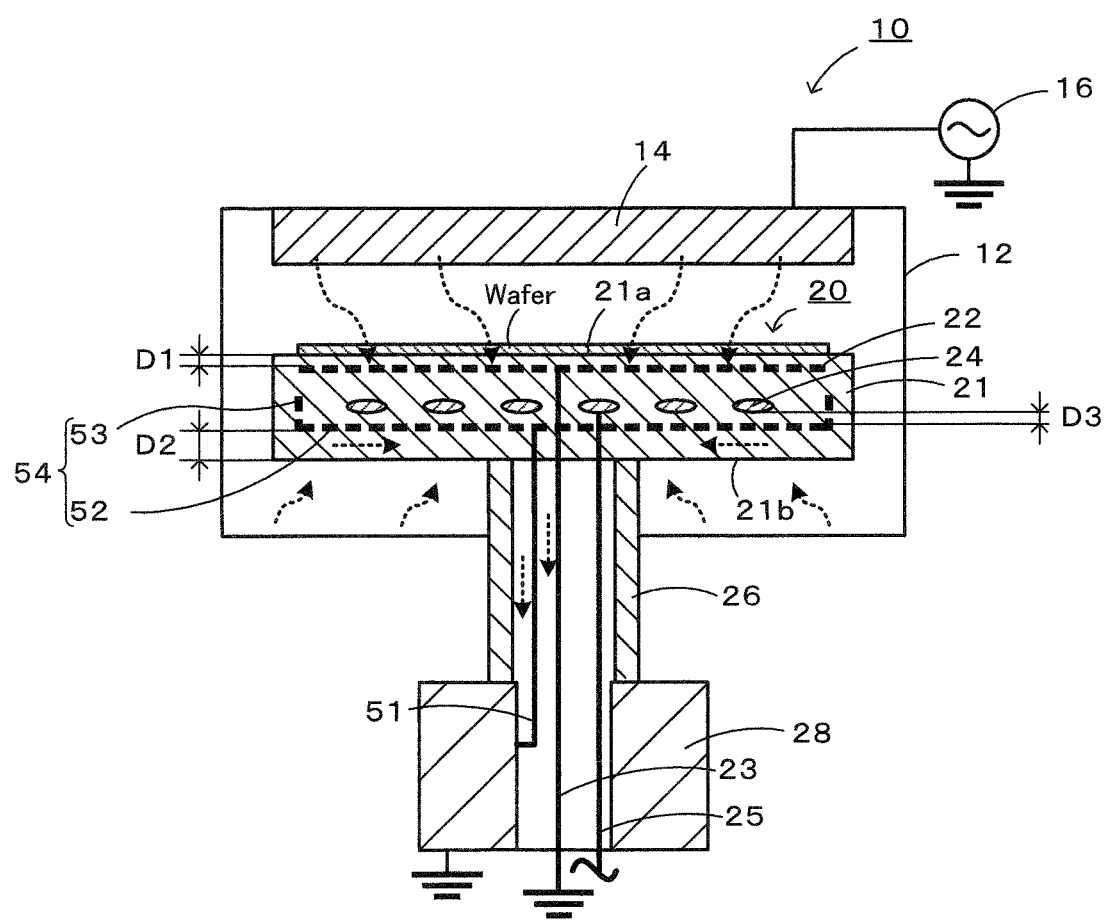
FIG. 4 is a longitudinal sectional view of a modification of the plasma treatment device 10.

A shield electrode 54 illustrated in FIG. 4 may be used instead of the shield electrode 50 in FIG. 3. The shield electrode 54 includes a planar shield portion 52 and a side shield portion 53. The planar shield portion 52 is a metal planar member embedded in the ceramic plate 21 so as to be closer to the back surface 21b than the heater electrode 24 and having a larger outer diameter than the heater electrode 24. The planar shield portion 52 is parallel to the wafer placement surface 21a. A distance D2 from the back surface 21b to the planar shield portion 52 is preferably larger than a distance D1 from the wafer placement surface 21a to the plasma electrode 22. More preferably, the distance D2 is larger than the distance D1 by 2.0 mm or more. The distance D2 is larger than a distance D3 from the planar shield portion 52 to the heater electrode 24. The planar shield portion 52 is connected to the metal part 28 (ground) via the conductive wire 51 disposed inside the cylindrical shaft 26. The side shield portion 53 is a metal cylindrical member disposed so as to extend toward the wafer placement surface 21a from the outer edge of the planar shield portion 52. The side shield portion 53 has a distal end positioned between the wafer placement surface 21a and the heater electrode 24 (specifically, between the plasma electrode 22 and the heater electrode 24). The planar shield portion 52 and the side shield portion 53 may be a mesh of a metal material (such as Mo). In FIG. 4, the planar shield portion 52 prevents coupling between the plasma that has flowed around to the back surface side of the ceramic plate 21 and the heater electrode 24. It is therefore possible to prevent the occurrence of an abnormal condition (such as abnormal heat generation or abnormal expansion of the heater electrode) caused by such coupling. In addition, the planar shield portion 52 has a larger outer diameter than the heater electrode 24. This makes it easy to prevent coupling between the plasma and the outer peripheral portion of the heater electrode 24. Furthermore, the side shield portion 53 prevents coupling between the plasma that has flowed around to the side surface side of the ceramic plate 21 and the heater electrode 24. It is therefore possible to prevent the occurrence of an abnormal condition caused by such coupling. The distal end of the side shield portion 53 is positioned between the wafer placement surface 21a and the heater electrode 24. Thus, coupling between the plasma that has flowed around to the side surface side of the ceramic plate 21 and the heater electrode 24 can be reliably prevented. Furthermore, the distance D2 from the back surface 21b to the planar shield portion 52 is larger than the distance D1 from the wafer placement surface 21a to the plasma electrode 22. This can reduce the influence of the planar shield portion 52 on the plasma on the wafer side. Furthermore, the distance D2 from the back surface 21b to the planar shield portion 52 is larger than the distance D3 from the planar shield portion 52 to the heater electrode 24. This makes it less likely that the plasma flows into the planar shield portion 52 from the back surface 21b, and can reduce the influence of the planar shield portion 52 on the plasma on the wafer placement surface side.

Figure 5:
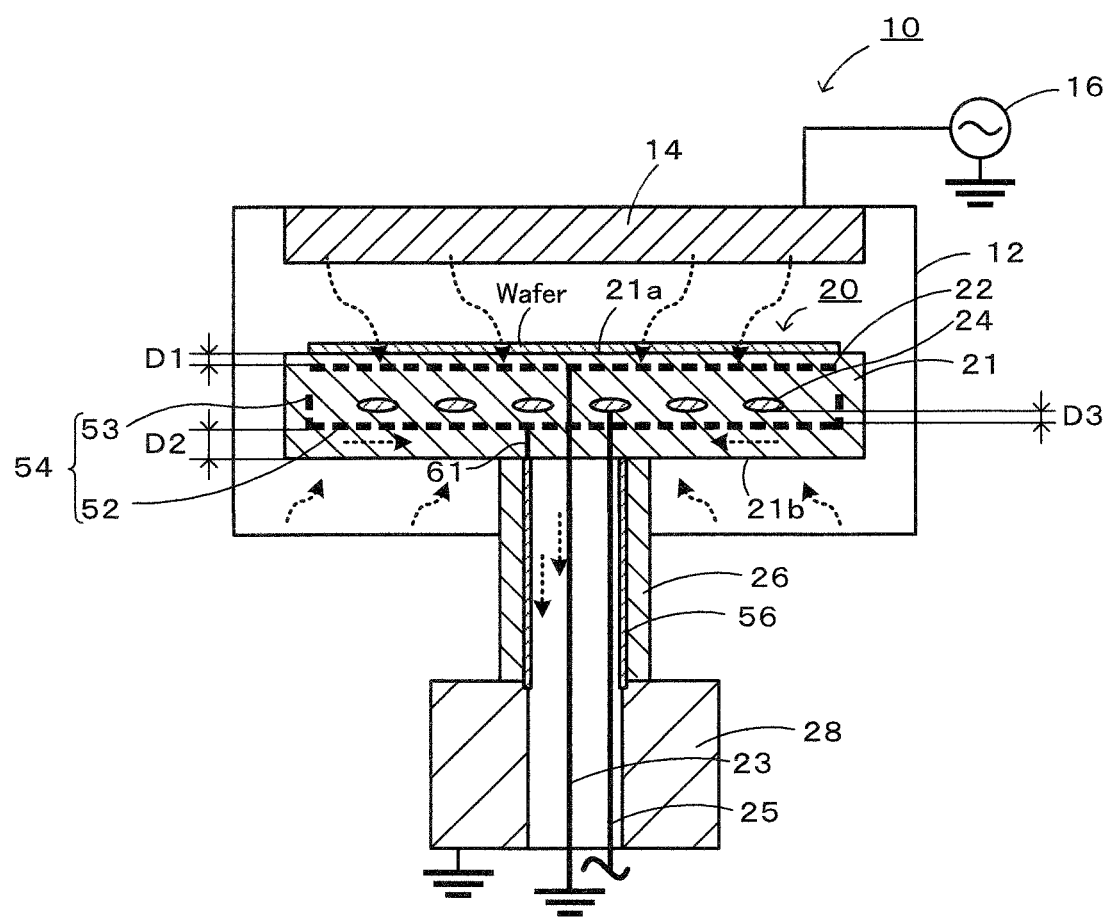
FIG. 5 is a longitudinal sectional view of a modification of the plasma treatment device 10.

A conductor 56 illustrated in FIG. 5 may be used instead of the conductive wire 51 in FIG. 4. The conductor 56 is disposed so as to cover the entire inner surface of the cylindrical shaft 26. As illustrated in FIG. 5, the planar shield portion 52 is connected to the conductor 56 via a conductive wire 61 embedded in the ceramic plate 21, and the conductor 56 is connected to the metal part 28 (ground). The conductor 56 may be a coating film made of conductive ceramic. Examples of the conductive ceramic include SiC, TiC, and TiN. In FIG. 5, it is not necessary to allow a member to pass through the inside of the cylindrical shaft 26 to connect the shield electrode 54 to the metal part 28. Thus, other members (such as a heater electrode connecting member and a plasma electrode connecting member) are easily arranged in the space inside the cylindrical shaft 26. In FIG. 5, the conductor 56 is disposed on the inner surface of the cylindrical shaft 26. However, the conductor 56 may be disposed on the outer surface of the cylindrical shaft 26. While the conductor 56 is disposed on the entire inner surface of the cylindrical shaft 26, the conductor 56 may be disposed in a line from the upper end to the lower end of the cylindrical shaft 26 (to a position adjoining the metal part 28), rather than disposed on the entire surface.

Figure 6:
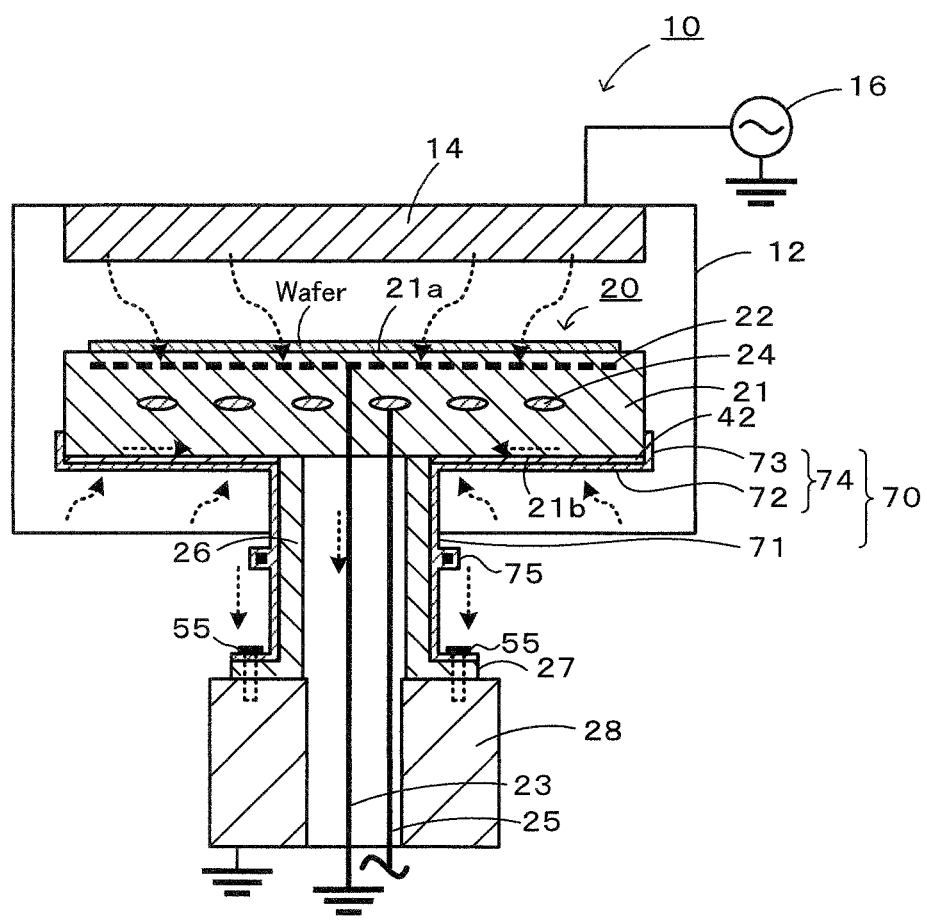
FIG. 6 is a longitudinal sectional view of a modification of the plasma treatment device 10.

A metal structure 70 illustrated in FIG. 6 may be used instead of the metal cover 40 and the conductive wire 41 in FIG. 2. The metal structure 70 is formed by integrating a metal sleeve 71 and a metal cover 74. The metal sleeve 71 covers the entire outer surface of the cylindrical shaft 26. The metal sleeve 71 is secured to the metal part 28 by conductive bolts 55 through a flange 27 at the lower end of the cylindrical shaft 26. Accordingly, the metal structure 70 is connected to the metal part 28 (ground) via the bolts 55. The metal cover 74 includes a planar shield portion 72, which is a doughnut-shaped metal plate, and a side shield portion 73 disposed so as to extend upward from the outer edge of the planar shield portion 72. The planar shield portion 72 is arranged on the back surface 21*b* with the low thermal conductive layer 42 interposed therebetween, is parallel to the wafer placement surface 21*a*, and has a larger outer diameter than the heater electrode 24. The side shield portion 73 has a distal end positioned between a plane on which the heater electrode 24 lies and the back surface 21*b*. To attach the metal structure 70 to the cylindrical shaft 26, for example, the metal structure 70 is vertically halved into two half members, and the two half members are arranged so as to surround the cylindrical shaft 26, and are then secured to the cylindrical shaft 26 by a fastening tool 75 (such as bolts or a cable tie). In FIG. 6, the planar shield portion 72 prevents coupling between the plasma that has flowed around to the back surface side of the ceramic plate 21 and the heater electrode 24. In addition, the planar shield portion 72 has a larger outer diameter than the heater electrode 24. This makes it easy to prevent coupling between the plasma and the outer peripheral portion of the heater electrode 24. Furthermore, the side shield portion 73 prevents coupling between the plasma that has flowed around to the side surface side of the ceramic plate 21 and the heater electrode 24. It is therefore possible to prevent the occurrence of an abnormal condition caused by such coupling. The distal end of the side shield portion 73 is positioned between a plane on which the heater electrode 24 lies and the back surface 21*b*. This makes it easy to maintain thermal uniformity across the wafer placement surface 21*a*. Moreover, since the low thermal conductive layer 42 prevents the heat of the ceramic plate 21 from being directly transmitted to the metal cover 74, the metal cover 74 can be prevented from being softened or melted. Such an effect is effectively obtained, in particular, when the metal cover 74 is made of Al or an Al alloy and the low thermal conductive layer 42 is an alumina layer. Since the metal cover 74 is supported by the integrated metal sleeve 71, the screws 43 in FIG. 2 can be omitted. Omission of the screws 43 makes it easy to maintain thermal uniformity across the ceramic plate 21. The metal cover 40 in FIG. 2 may have a side shield portion. Alternatively, a conductive film or a metal sleeve that covers the entire outer surface of the cylindrical shaft 26 may be used instead of the conductive wire 31 in FIG. 1 or the conductive wire 41 in FIG. 2.

In the embodiment described above, the upper electrode 14 is connected to the RF power supply 16, and the plasma electrode 22 is connected to the ground. Alternatively, the plasma electrode 22 may be connected to the RF power supply 16, and the upper electrode 14 may be connected to the ground. The same applies to FIG. 2 to FIG. 6.

The present application claims priority from JP Patent Application No. 2019-219545 filed Dec. 4, 2019, the entire contents of which are incorporated herein by reference.

What is claimed is:

1. A ceramic heater comprising:
a disk-shaped ceramic plate having a wafer placement surface on a front surface thereof, the ceramic plate having a plasma electrode and a heater electrode embedded therein in this order, from closest to the wafer placement surface to farthest, in such a manner that the plasma electrode and the heater electrode are spaced apart from each other;
a cylindrical shaft that supports the ceramic plate from a back surface of the ceramic plate;
a plasma electrode connecting member arranged in the cylindrical shaft, the plasma electrode connecting member being connected to the plasma electrode;
a heater electrode connecting member arranged in the cylindrical shaft, the heater electrode connecting member being connected to the heater electrode; and
a planar shield portion arranged on the back surface of the ceramic plate or embedded in the ceramic plate so as to be closer to the back surface than the heater electrode, the planar shield portion being connected to ground; and
a side shield portion disposed so as to extend toward the wafer placement surface from an outer edge of the planar shield portion, wherein
the planar shield portion and the side shield portion are embedded in the ceramic plate, and
the side shield portion has a distal end positioned between the wafer placement surface and the heater electrode.

2. The ceramic heater according to claim 1, wherein the planar shield portion is a conductive ceramic coating film, a metal mesh, or a metal plate.

3. The ceramic heater according to claim 1, wherein the planar shield portion is connected to the ground via a cylindrical conductor on an inner surface or an outer surface of the cylindrical shaft.

4. The ceramic heater according to claim 1, wherein the planar shield portion has a larger outer diameter than the heater electrode.

5. The ceramic heater according to claim 1, wherein the ceramic plate and the cylindrical shaft are made of AlN ceramic, and the planar shield portion is made of Al or an Al alloy.

6. The ceramic heater according to claim 1, wherein the side shield portion is made of Al or an Al alloy.

7. The ceramic heater according to claim 1, wherein a distance from the back surface to the planar shield portion is larger than a distance from the wafer placement surface to the plasma electrode.

8. The ceramic heater according to claim 7, wherein the distance from the back surface to the planar shield portion is longer than the distance from the wafer placement surface to the plasma electrode by 2.0 mm or more.

9. The ceramic heater according to claim 1, wherein the distal end of the side shield portion does not reach the height of the plasma electrode.

* * * * *